(12) United States Patent
Nakao

(10) Patent No.: US 8,115,882 B2
(45) Date of Patent: Feb. 14, 2012

(54) LIQUID CRYSTAL DISPLAY DEVICE AND MANUFACTURING METHOD THEREOF

(75) Inventor: Hajime Nakao, Azumino (JP)

(73) Assignee: Sony Corporation, Tokyo (JP)

( * ) Notice: Subject to any disclaimer, the term of this patent is extended or adjusted under 35 U.S.C. 154(b) by 287 days.

(21) Appl. No.: 12/607,705

(22) Filed: Oct. 28, 2009

(65) Prior Publication Data

US 2010/0134740 A1 Jun. 3, 2010

(30) Foreign Application Priority Data

Dec. 1, 2008 (JP) ................... 2008-306043

(51) Int. Cl.
*G02F 1/1368* (2006.01)
*H01L 21/336* (2006.01)
*H01L 29/786* (2006.01)

(52) U.S. Cl. ............ 349/40; 349/42; 349/141; 349/187; 438/30

(58) Field of Classification Search .................... 349/40, 349/42, 43, 138, 141, 151, 187; 257/59, 257/72; 345/92; 438/30, 151
See application file for complete search history.

(56) References Cited

U.S. PATENT DOCUMENTS

| 2001/0007779 A1 | 7/2001 | Lee et al. |
| 2001/0046027 A1 | 11/2001 | Tai et al. |
| 2002/0041354 A1 | 4/2002 | Noh et al. |
| 2007/0171319 A1 | 7/2007 | Fujita et al. |
| 2009/0086143 A1 * | 4/2009 | Kaneko et al. ............... 349/139 |

FOREIGN PATENT DOCUMENTS

| JP | A 2001-83540 | 3/2001 |
| JP | A 2001-235763 | 8/2001 |
| JP | A 2002-182230 | 6/2002 |
| JP | A 2007-226175 | 9/2007 |
| JP | 2009-151285 | * 7/2009 |

* cited by examiner

*Primary Examiner* — Dung Nguyen
*Assistant Examiner* — Tai Duong
(74) *Attorney, Agent, or Firm* — K&L Gates LLP

(57) ABSTRACT

A liquid crystal display includes an interlayer resin film covering a surface of the display area including thin film transistors, first electrodes formed of transparent conductive material on the surface of the interlayer resin film in regions defined by scan and signal lines and electrically connected to the thin film transistors. A second insulating film formed on the surface of the interlayer resin film includes the first electrodes and second electrodes formed of transparent conductive material on the second insulating film, the second electrodes having slits defined at the scan lines and signal lines. A circuit including thin film transistors with exposed channel regions is on the display area's periphery. The interlayer resin film directly covers the thin film transistors' channel regions in the display area and the peripheral area; and the surface of the display area's and peripheral circuit's interlayer resin films are covered with the second insulating film.

7 Claims, 12 Drawing Sheets

| TFT PORTION OF DISPLAY AREA | ELECTROSTATIC PROTECTION DEVICE SR | |
|---|---|---|
| | TFT PORTION | CONTACT HOLE PORTION |

| TFT PORTION OF DISPLAY AREA | ELECTROSTATIC PROTECTION DEVICE SR | |
|---|---|---|
| | TFT PORTION | CONTACT HOLE PORTION |
FIG. 7A
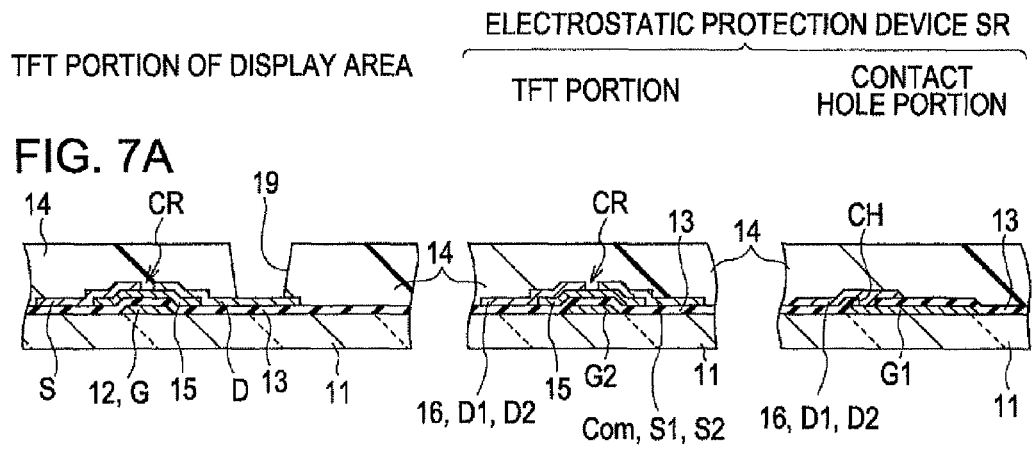
FIG. 7B
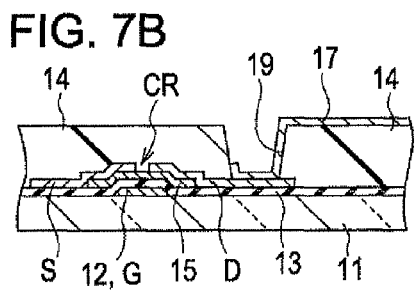
FIG. 7C
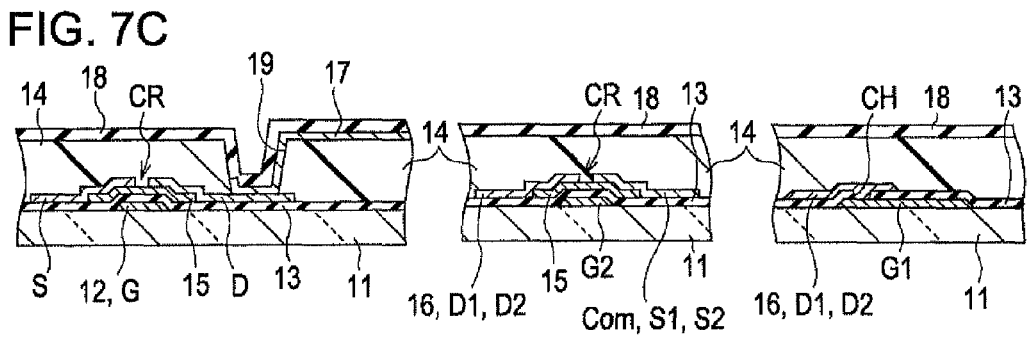
FIG. 7D
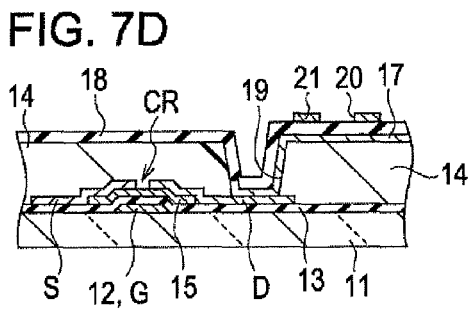

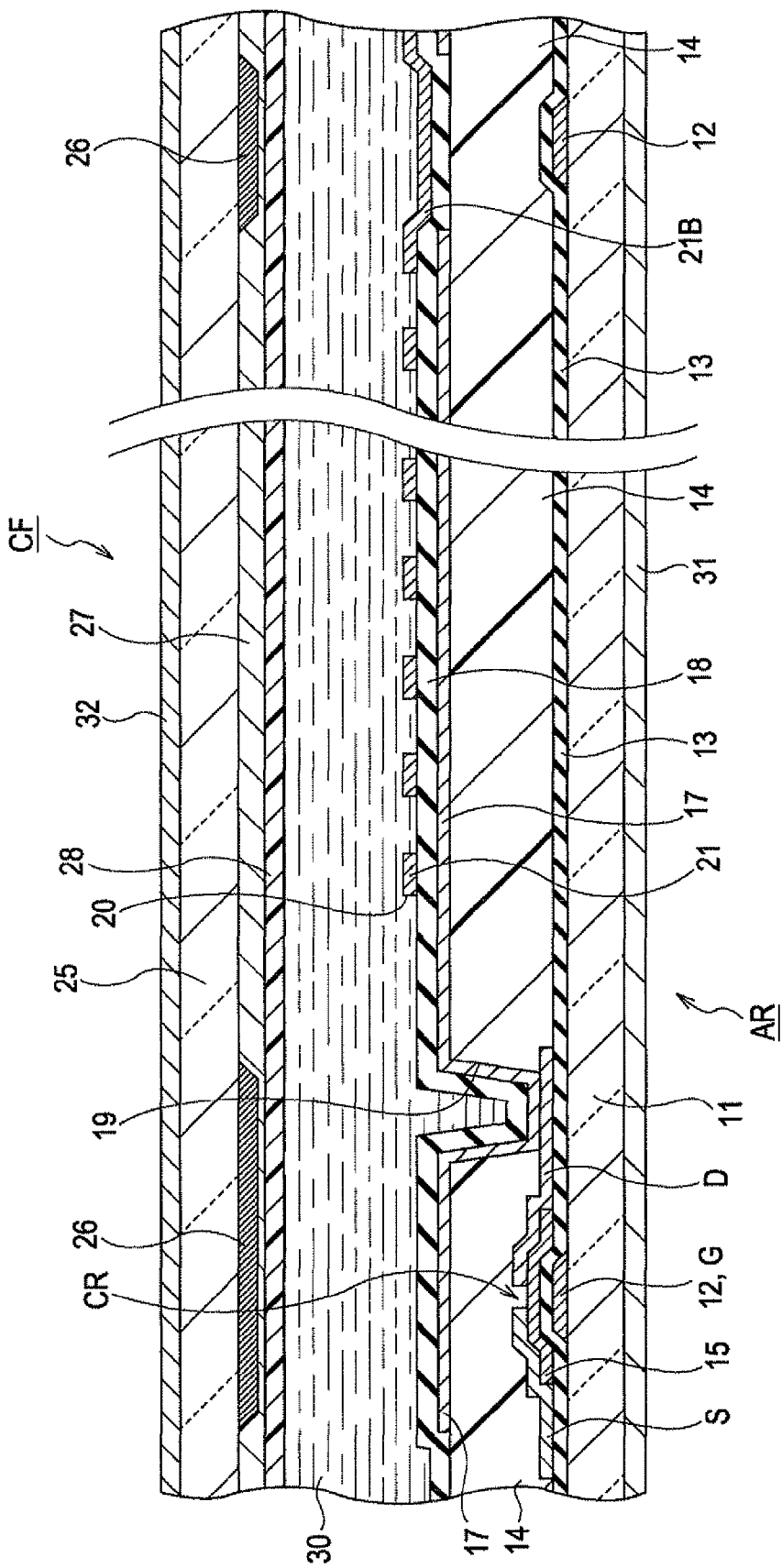

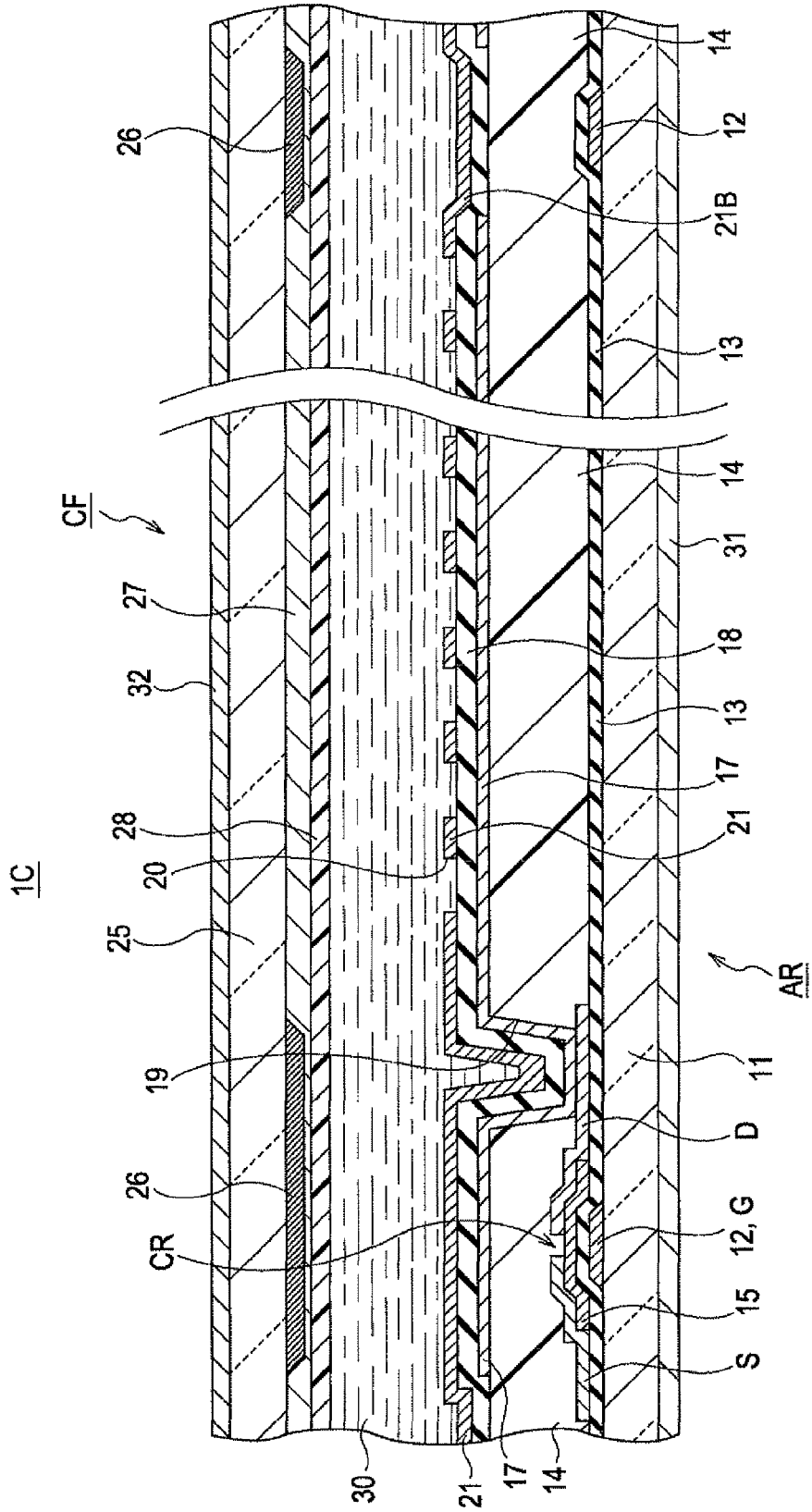

LIQUID CRYSTAL DISPLAY DEVICE AND MANUFACTURING METHOD THEREOF

BACKGROUND

1. Technical Field

The present invention relates to a fringe field switching (FFS) mode liquid crystal display device and a method for manufacturing such a device. More particularly, the invention relates to an FFS mode liquid crystal display device and a method for manufacturing such a device, in which it is not only possible to simplify the layered structures of a display area and a peripheral circuit formed on a substrate thereof, but also to decrease manufacturing costs thereof while guaranteeing moisture resistance equivalent to that of the related art, and in which a variation in the characteristics of the TFTs of the peripheral circuit is small, thus guaranteeing a highly reliable operation of such a device.

2. Related Art

Many of the liquid crystal display devices being used are of the vertical electric field type which has a pair of transparent substrates with electrodes and the like formed on their surfaces and a liquid crystal layer that is sandwiched between the pair of substrates, and displays various kinds of information by rearranging the liquid crystals via application of a voltage to the electrodes on the two substrates. Such vertical electric field type liquid crystal display devices are generally of a twisted nematic (TN) mode, but since this mode has the problem of a narrow viewing angle, various improved vertical electric field type liquid crystal display devices of a vertical alignment (VA) mode, a multi-domain vertical alignment (MVA) mode or the like have been developed.

On the other hand, liquid crystal display devices that, unlike the vertical electric field type liquid crystal display devices described above, are of an in-plane switching (IPS) mode or a fringe field switching (FFS) mode, in which a pair of electrodes constituted of a pixel electrode and a common electrode are provided on only one of the substrates, are also known.

Of these, the IPS mode liquid crystal display device disposes the pair of electrodes on the same layer and applies the electric field to the liquid crystals in a direction almost parallel to the substrates, thus rearranging the liquid crystal molecules in a direction parallel to the substrates. Therefore, the IPS mode liquid crystal display device is also called a transverse electric field type liquid crystal display device, and has the advantage of providing a viewing angle that is extremely broad in comparison to the vertical electric field type liquid crystal display devices described above. With the IPS mode liquid crystal display device, however, because the pair of electrodes are provided on the same layer in order to apply an electric field to the liquid crystals, there is the problem that the liquid crystal molecules, which are positioned above the pixel electrode, are inadequately driven, and this results in lowering of transmissivity and other aspects.

What might be termed diagonal electric field type FFS mode liquid crystal display devices have been developed in order to resolve the problems of the IPS mode liquid crystal display device (see JP-A-2001-235763 and JP-A-2002-182230). In such FFS mode liquid crystal display devices, the pixel electrodes and common electrodes for applying the electric field to the liquid crystal layer are disposed in different layers, each with an insulating film (hereinafter referred to as "inter-electrode insulating film") interposed therebetween. Such an FFS mode liquid crystal display device has a broader viewing angle and higher contrast than the IPS mode liquid crystal display device, and can be driven with low voltage as well as having higher transmissivity. Thus it has the feature of being able to achieve a bright display. In addition, the FFS mode liquid crystal display device has the advantage that the area of overlap, viewed from above, between the pixel electrodes and the common electrodes, is larger than that in the IPS mode liquid crystal display device. As a result, a larger auxiliary capacitance is generated and there is no need to specially provide an auxiliary capacitance wire, which enables a higher aperture ratio to be obtained than that in the IPS mode liquid crystal display device.

However, the FFS mode liquid crystal display devices disclosed in JP-A-2001-235763 and JP-A-2002-182230 has the problem that, because there is misalignment of the liquid crystal molecules due to a potential difference between the signal line and the pixel electrode, portions at the vicinity of the signal line constitute regions that do not contribute to the display and therefore the aperture ratio decreases. Another problem is that there is a coupling capacitance between the signal line and the pixel electrode, which causes deterioration in display quality such as crosstalk. An approach that is practiced to address such problems is to employ an interlayer resin film such as is used in the above-mentioned vertical electric field type liquid crystal display devices, and to dispose the pixel electrodes, the common electrodes and the like on the interlayer resin film, in order to eliminate the influence of the potential of the signal line (see JP-A-2001-083540 and JP-A-2007-226175).

In the liquid crystal display device of the related art, peripheral circuits comprising thin film transistors (TFTs), which are constituted of an electrostatic protection circuit, a driver circuit, a logic circuit, and the like, are formed on the peripheral portion of the display area, and a passivation film formed of silicon nitride is formed so as to cover the channel regions of the TFTs of the peripheral circuits as well as the channel regions of the TFTs used as the switching elements of the display area. The passivation film is provided in order to guarantee the moisture resistance of the channel regions of the TFTs of the peripheral circuits as well as the channel regions of the TFTs of the display area. In the case where the interlayer resin film is formed to provide an improved aperture ratio as in the liquid crystal display device disclosed in JP-A-2001-083540 and JP-A-2007-226175, the interlayer resin film is formed on the surface of the passivation film, similar to the interlayer resin film provided in the vertical electric field type liquid crystal display device disclosed in JP-A-2001-235763 and JP-A-2002-182230.

That is to say, in the vertical electric field type liquid crystal display device as disclosed in JP-A-2001-235763 and JP-A-2002-182230, the channel regions of the TFTs of the peripheral circuits as well as the channel regions of the TFTs of the display area, which are used as the switching elements, are covered with an insulating film comprising two layers of a passivation film and an interlayer resin film. On the contrary, in the case of the transverse electric field type liquid crystal display device as disclosed in JP-A-2001-083540 and JP-A-2007-226175, the channel regions of the TFTs of the peripheral circuits as well as the channel regions of the TFTs of the display area, which are used as the switching elements, are covered with an insulating film comprising two layers of a passivation film and an interlayer resin film, similar to the vertical electric field type. Moreover, the channel regions are also covered with the inter-electrode insulating film provided between the pixel electrode and the common electrode, and are therefore covered with an insulating film comprised of at least three layers. Therefore, the liquid crystal display device disclosed in JP-A-2001-083540 and JP-A-2007-226175 can reliably provide improved aperture ratio but many layered structures have to be formed on one transparent substrate, so that more manufacturing processes are needed and the manufacturing costs will increase.

Inventors of the application have been persistently diligent in their investigation of the structure of the transverse electric field liquid crystal display device disclosed in JP-A-2001-083540 and JP-A-2007-226175. As a result of the studies, the inventors have discovered that, since the inter-electrode insulating film and the passivation film are formed of the same silicon nitride, sufficient moisture resistance can be secured when the passivation film was not provided and the channel regions of the TFTs of the display area, which are used as the switching elements, were covered with only the interlayer resin film and the inter-electrode insulating film. Such findings have already been filed for patent application (Japanese Patent Application No. 2007-309978; hereinafter referred to as "Prior Application"). Since the liquid crystal display device of Prior Application does not have the passivation film for the TFTs of the display area, the passivation film is also not provided for the TFTS of the peripheral circuits formed on the peripheral portion of the display area so that the channel regions are directly covered with the inter-electrode insulating film.

In the liquid crystal display device of Prior Application, the channel regions of the TFTs of the peripheral circuit are covered with the inter-electrode insulating film by the following steps.

A first step in which similar to the TFTs of the display area, a gate electrode, a gate insulating film, a semiconductor layer, a source electrode and a drain electrode are formed on a TFT forming region of the peripheral circuit which is formed on a peripheral portion of the display area, thus forming TFTs in which the channel regions are exposed.

A second step in which an entire surface of the substrate obtained in the first step is covered with an interlayer resin film, contact holes are formed on the interlayer resin film so as to expose the drain electrodes of the TFTs of the display area, and the interlayer resin film on the peripheral portion of the display area is removed.

A third step in which the entire surface of the substrate obtained in the second step is covered with a transparent conductive material such as ITO (indium tin oxide) or IZO (indium zinc oxide), which is then etched so as to form a lower electrode on the surface of the interlayer resin film of the display area.

A fourth step in which the entire surface of the substrate obtained in the third step is covered with an inter-electrode insulating film formed of silicon nitride or silicon oxide.

In the second step, the interlayer resin film is formed on the display area by a photolithographic method using a photoresist material, and at this time, a developing process, a bleaching process, and a firing process are performed. In the third step, after the transparent conductive material is covered, the transparent conductive material is patterned by photolithographic and etching methods. In the fourth step, the inter-electrode insulating film is formed by, for example, a CVD method.

Therefore, in the second step of the liquid crystal display device of Prior Application, the channel regions of the TFTs of the peripheral circuit are exposed to a developing solution during the photolithographic process of the interlayer resin film and to the atmosphere during the bleaching and firing processes. Moreover, in the third step, the channel regions are exposed to a cleaning solution during the cleaning before the film is formed and are exposed to a resist peeling solution after the film is formed. Furthermore, in the fourth step, the channel regions are exposed to a cleaning solution during the cleaning before the film is formed and are always exposed to the atmosphere until the film forming of the inter-electrode insulating film is completed.

Therefore, in the liquid crystal display device of Prior Application, since it is difficult to prevent the channel regions of the TFTs in the peripheral circuits of the display area from being exposed to various chemical solutions until they are covered with the inter-electrode insulating film, the damage to the channel portion will increase, thus increasing the variation in the characteristics of the TFTs of the peripheral circuits and impairing the reliability thereof.

SUMMARY

An advantage of some aspects of the invention is that it provides an FFS mode liquid crystal display device and a method for manufacturing such a device, in which it is not only possible to simplify the layered structures of a display area and a peripheral circuit formed on a substrate thereof, but also to decrease manufacturing costs thereof while guaranteeing moisture resistance equivalent to that of the related art, and in which a variation in the characteristics of the TFTs of the peripheral circuit is small, thus guaranteeing highly reliable operation of such a device.

According to an aspect of the invention, there is provided a liquid crystal display device including: a liquid crystal layer; and a pair of substrates that enclose the liquid crystal layer therebetween, wherein: the liquid crystal layer side of one of the pair of substrates being provided with: a plurality of scan lines and signal lines that are arranged in a matrix on a display area with a first insulating film therebetween; thin film transistors which are formed at the vicinities of the intersections of the plurality of scan lines and signal lines, and of which the channel regions are exposed; an interlayer resin film that covers an entire surface of the display area including the surface of the thin film transistors; first electrodes which are formed of a transparent conductive material and are formed on the surface of the interlayer resin film in each of regions defined by the plurality of scan lines and signal lines so as to be electrically connected to the thin film transistors; a second insulating film that is formed on an entire surface of the interlayer resin film including the first electrodes; and second electrodes which are formed of a transparent conductive material and are formed on the second insulating film, the second electrodes having a plurality of slits formed at positions corresponding to the regions defined by the plurality of scan lines and signal lines, wherein: a peripheral circuit, which includes thin film transistors of which the channel regions are exposed, is formed on a peripheral portion of the display area; the interlayer resin film directly covers the channel regions of the thin film transistors of the display area and directly covers the channel regions of the thin film transistors of the peripheral circuit; and the surface of the interlayer resin film above the thin film transistors on the display area and the surface of the interlayer resin film above the thin film transistors on the peripheral circuit are covered with the second insulating film.

The liquid crystal display device of the aspect of the invention has, on its display area, the plurality of scan lines and the plurality of signal lines arranged in a matrix with the first insulating film therebetween, and the first electrodes and the second electrodes with the plurality of slits, which both face each other with the second insulating film therebetween, are formed of the transparent conductive material, and each pair of the first and second electrodes are formed in each region defined by scan lines and the signal lines on the interlayer resin film. With this arrangement, the liquid crystal display device of the invention can be operated as a FFS-type liquid crystal display device. The transparent conductive material may be formed of ITO or IZO. Moreover, in the liquid crystal display device of the above aspect of the invention, the first electrodes and the second electrodes with the plurality of slits, which both face each other with the second insulating film therebetween and are formed of the transparent conductive material, are formed on the interlayer resin film. Therefore, the capacitance of the signal lines and the pixel electrodes can be lowered, so that the pixel electrodes can be extended above the signal lines, whereby the liquid crystal display device can exhibit high aperture ratio.

In the liquid crystal display device of the above aspect of the invention, the first electrodes are electrically connected to the electrodes of the TFTs, for example, the drain electrodes and thus can function as the pixel electrodes. Moreover, the second electrodes function as the common electrodes and may be appropriately electrically connected to the common lines at the peripheral portion of the display area.

A film formed of silicon oxide or silicon nitride can be used for the first and second insulating films, which may be either single-layer or multiple-layer. From the viewpoint of insulation and moisture resistance properties, silicon nitride will be preferable. Moreover, as the switching elements in the liquid crystal display device of the invention, low temperature poly silicon (LTPS) type thin film transistors (TFTs) and amorphous silicon (a-Si) type TFTs, for example, can be used.

Moreover, in the liquid crystal display device of the above aspect of the invention, although the channel regions of the TFTs of the display area and the TFTs of the peripheral circuit are exposed, since the channel regions are directly covered with the interlayer resin film and are not covered with the passivation film, as used in the related art. However, since the surfaces of the channel regions are not only directly covered with the interlayer resin film but also covered with the second insulating film, it is possible to guarantee sufficient moisture resistance properties. Therefore, according to the liquid crystal display device of the aspect of the invention, it is possible to provide a liquid crystal display device which can be manufactured with a simple structure and at a low cost, compared to the liquid crystal display device of the related art, since the passivation film is not formed.

The interlayer resin film may be formed of photoresist material or silicon resin. When the silicon resin is used for the interlayer resin film, the film forming temperature of the second insulating film can be increased, and thus the formed second insulating film can have higher density, thus providing better moisture resistance.

In the liquid crystal display device of the above aspect of the invention, the peripheral circuit may include at least one of an electrostatic protection circuit, a driver circuit, and a logic circuit.

In the peripheral portion of the display area of the liquid crystal display device, peripheral circuits are formed appropriately including an electrostatic protection circuit, a driver circuit, a logic circuit, and the like. These peripheral circuits include TFTs (including those having diodes connected thereto) as switching elements or amplifier elements. A liquid crystal display device having such peripheral circuits can effectively exhibit the advantages of the invention. Among such peripheral circuits, the driver circuit may include a scan line-driving circuit, a signal line-driving circuit, a demultiplexer, and a level shifter, and the logic circuit may include an inverter circuit, a NAND circuit, a NOR circuit, and a ring oscillator.

In the liquid crystal display device of the above aspect of the invention, it is preferable that the thickness of the interlayer resin film is in the range of 1.5 μm to 3.0 μm.

If the interlayer resin film has a thickness of less than 1.5 μm, steps are formed at positions of the first or second electrodes where the TFTs of the display area exist, disadvantageously increasing the parasitic capacitance between the signal lines and the pixel electrodes and leading to deterioration of the display quality. On the other hand, if the interlayer resin film has a thickness of more than 3.0 μm, the optical absorption rate of the interlayer resin film increases, disadvantageously lowering the brightness of the display area.

Moreover, it is preferable that the thickness of the second insulating film of the liquid crystal display device of above aspect of the invention is in a range of 2000 angstrom to 6000 angstrom.

If the second insulating film has a thickness of less than 2000 angstrom, it is not desirable because it is difficult to secure insulation and water resistance properties necessary for thickness channel regions of the TFTs used as the switching elements. On the other hand, if the second insulating film has a thickness of more than 6000 angstrom, it is not desirable because the capacitance between the first electrodes and the second electrodes functioning as the auxiliary capacitance decreases, which disadvantageously results in noticeable flicker and a higher voltage being necessary for activating the liquid crystal molecules.

In the liquid crystal display device of the above aspect of the invention, it is preferable that the TFTs of the display area are covered with the first or second electrodes in plan view.

In the liquid crystal display device of the above aspect of the invention, the TFTs of the display area are covered with the first or second electrodes as well as the interlayer resin film and the second insulating film. When the first or second electrodes are used as the covering film of the switching elements, the first or second electrodes can sufficiently function as a protective film, and it is thus possible to suppress variation (deterioration) in the characteristics of the switching elements due to external causes (moisture or liquid crystal impurities). Moreover, in the liquid crystal display device of the above aspect of the invention, since it is necessary to cover the switching elements with only one of the first and second electrodes, one can be selected with regard to whichever is advantageous in terms of design purposes. Therefore, it is possible to increase the degree of freedom in design of the liquid crystal display device of the above aspect of the invention.

In the liquid crystal display device of the above aspect of the invention, it is preferable that the TFTs of the display area are covered with the first and second electrodes in plan view.

In the liquid crystal display device of the above aspect of the invention, since both the first and second electrodes are used as the covering film of the switching elements and thus further functions as the protective film, it is possible to more effectively suppress variation in the characteristics of the switching elements and to improve the long-term reliability of the switching elements. Moreover, according to the liquid crystal display device of the above aspect of the invention, since the size of the surfaces of the first and second electrodes increases, it is possible to obtain a larger auxiliary capacitance. Thus, it is possible to suppress flicker and thus to improve the display quality.

According to another aspect of the invention, there is provided a method for manufacturing a liquid crystal display device, including: a first step of preparing a first substrate on a display area, including: a plurality of scan lines and signal lines that are arranged in a matrix on a display area with a first insulating film therebetween; thin film transistors which are formed at the vicinities of the intersections of the plurality of scan lines and signal lines, and of which the channel regions are exposed; and a peripheral circuit which is formed on a peripheral portion of the display area and includes thin film transistors of which the channel regions are exposed; a second step of forming an interlayer resin film so as to cover the display area of the first substrate obtained in the first step and the peripheral portion of the display area, the interlayer resin film having a contact hole exposing one of the electrodes of the thin film transistors of the display area; a third step of forming first electrodes on the surface of the interlayer resin film of the display area in each of regions defined by the plurality of scan lines and signal lines, the first electrodes being formed of a transparent conductive material and electrically connected to one of the electrodes of the thin film transistors; a fourth step of forming a second insulating film over an entire surface of the interlayer resin film including the first electrodes; a fifth step of forming second electrodes on the second insulating film of the display area, the second electrodes being formed of a transparent conductive material and having a plurality of slits formed at positions corresponding to the regions defined by the plurality of scan lines and signal lines; and a sixth step of disposing a second substrate so as to oppose the surface of the first substrate obtained in the fifth step with a predetermined distance therebetween, bonding the substrates together, and filling liquid crystals into a space between the first and second substrates.

The peripheral circuit can naturally function as the passivation film of the related art due to the second insulating film even when the interlayer resin film is not formed. However, unless the interlayer resin film is formed on the surface of the peripheral circuit immediately after the forming of the peripheral circuit having the TFTs of which the channel regions are not covered with the passivation film, the following problems may occur. In the second step, the channel regions will be exposed to a developing solution during the photolithographic process of the interlayer resin film and to the atmosphere during the bleaching and firing processes. Moreover, in the third step, the channel regions will be exposed to a cleaning solution during the cleaning before the film is formed and will be exposed to a resist peeling solution after the interlayer resin film is removed or the contact hole is formed. Furthermore, in the fourth step, the channel regions will be exposed to pure water during the cleaning before the film is formed and will always be exposed to the atmosphere until the film forming of the inter-electrode insulating film is completed. Therefore, the TFTs of the peripheral circuit are likely to be damaged, and thus the variation in the characteristics of the TFTs will increase. Moreover, for example, even when the electrostatic protection circuit is formed as the peripheral circuit, the electrostatic protection circuit will not function properly after having been subjected to a wet cleaning process, and thus the throughput of the liquid crystal display device will decrease.

On the contrary, according to the method of manufacturing the liquid crystal display device of the above aspect of the invention, the peripheral circuit having the TFTs of which the channel regions are not covered with the passivation film is directly covered with the interlayer resin film. Therefore, since the TFTs of the peripheral circuit are prevented from being damaged, thus decreasing the variation in the characteristics of the TFTs, it is possible to provide a highly reliable liquid crystal display device and to provide high throughput of the liquid crystal display device. Moreover, since the channel regions and the electrodes of the TFTs of the display area and the TFTs of the peripheral circuit are covered with the interlayer resin film and the second insulating film, it is possible to secure sufficient insulation and moisture resistance properties.

BRIEF DESCRIPTION OF THE DRAWINGS

The invention will be described with reference to the accompanying drawings, wherein like numbers reference like elements.

FIGS. 7A to 7D are cross-sectional views of the main part illustrating the manufacturing processes of the liquid crystal display device according to the embodiments, subsequent to those of FIGS. 6A to 6E.

FIG. 9 is a cross-sectional view taken along the lines IX-IX in FIG. 8A.

FIG. 11 is a cross-sectional view taken along the lines XI-XI in FIG. 8C.

DESCRIPTION OF EXEMPLARY EMBODIMENTS

Exemplary embodiments of the invention will now be described with reference to the accompanying drawings. In the following embodiments, a liquid crystal display device and a method for manufacturing such a liquid crystal display device for realizing the technical idea of the invention are described using an FFS mode liquid crystal display device as an example. However, the following embodiments are not intended to limit the invention to the FFS mode liquid crystal display device, and the invention can be equally applied to other embodiments included in the scope of the claims. The invention could equally well be adapted to yield other embodiments within the scope and spirit of the claims.

Figure 1:
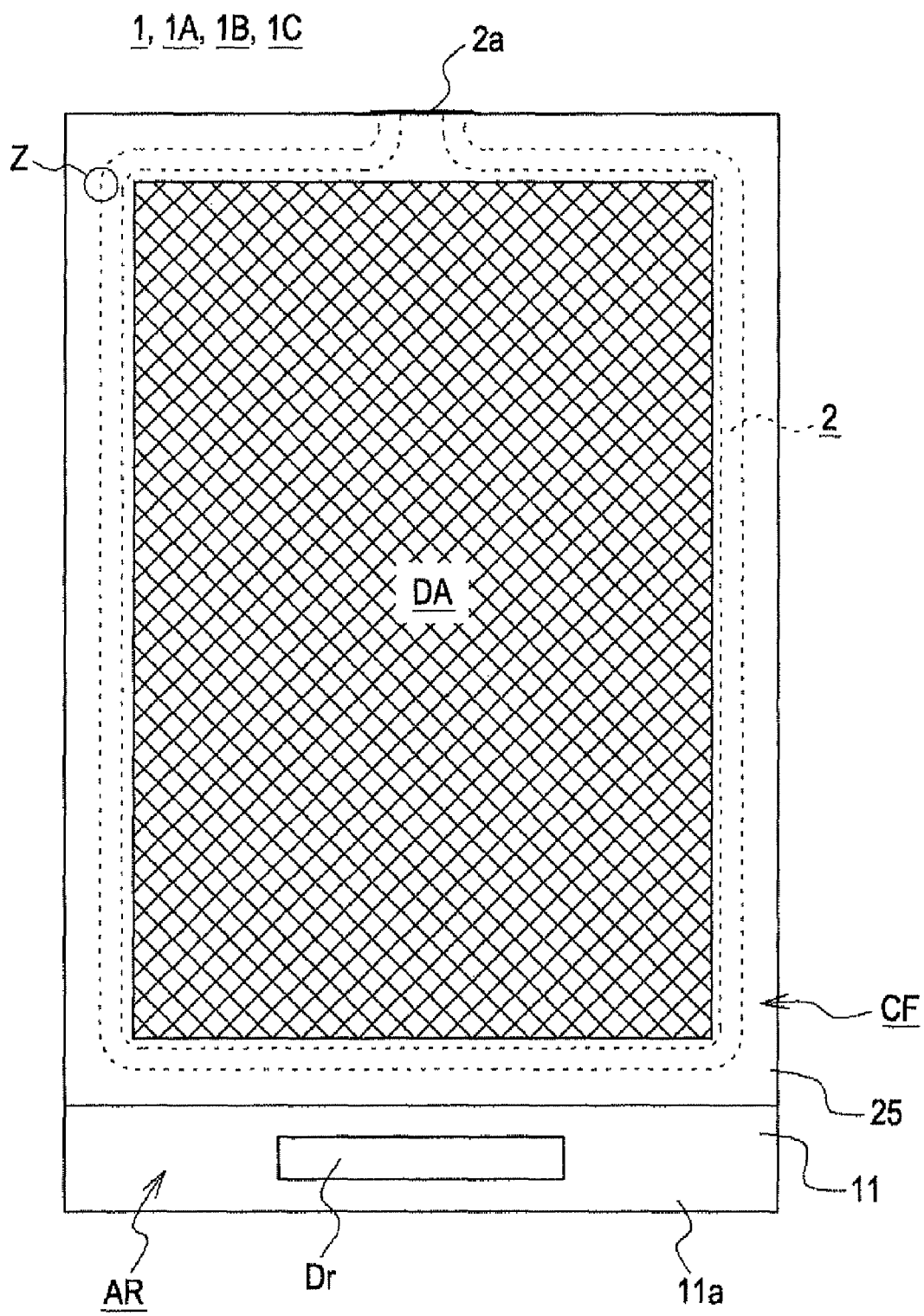
FIG. 1 is a plan view of a liquid crystal display device according to first to fourth embodiments of the invention.
Figure 2:
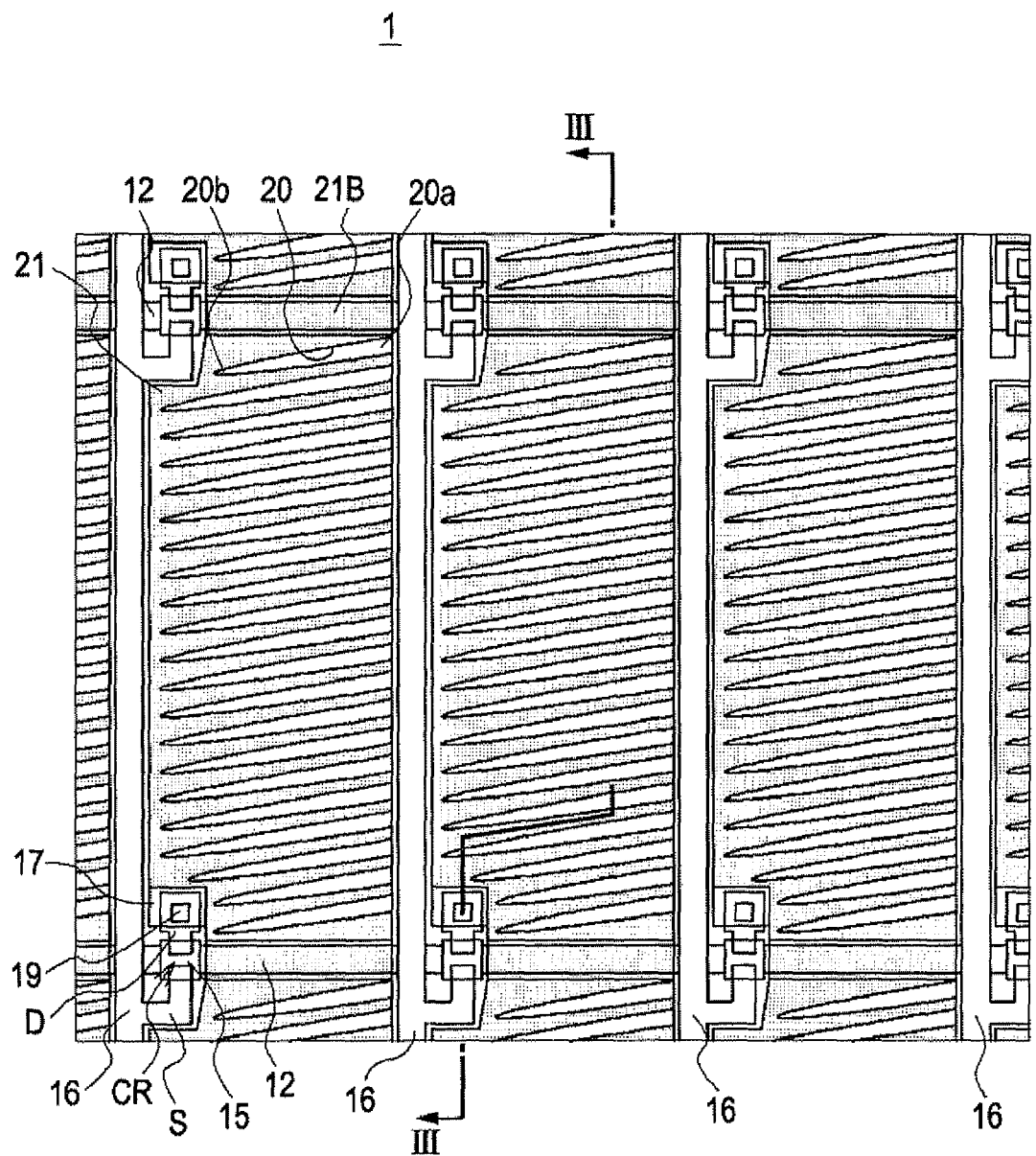
FIG. 2 is an enlarged plan view of three of a plurality of subpixels included in the liquid crystal display device according to the first embodiment, as viewed through a color filter substrate.
Figure 3:
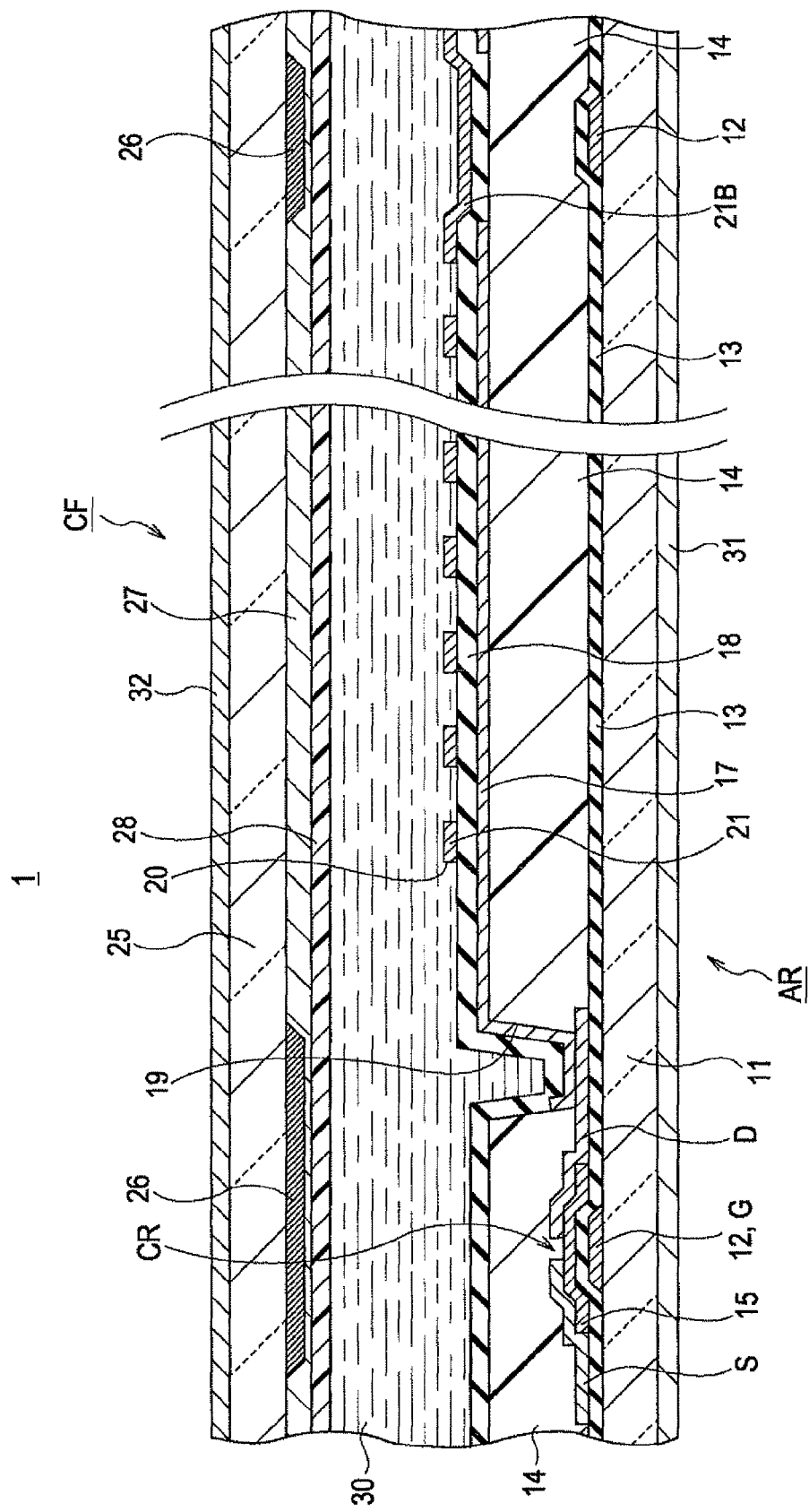
FIG. 3 is a cross-sectional view taken along the lines in FIG. 2.
Figure 4:
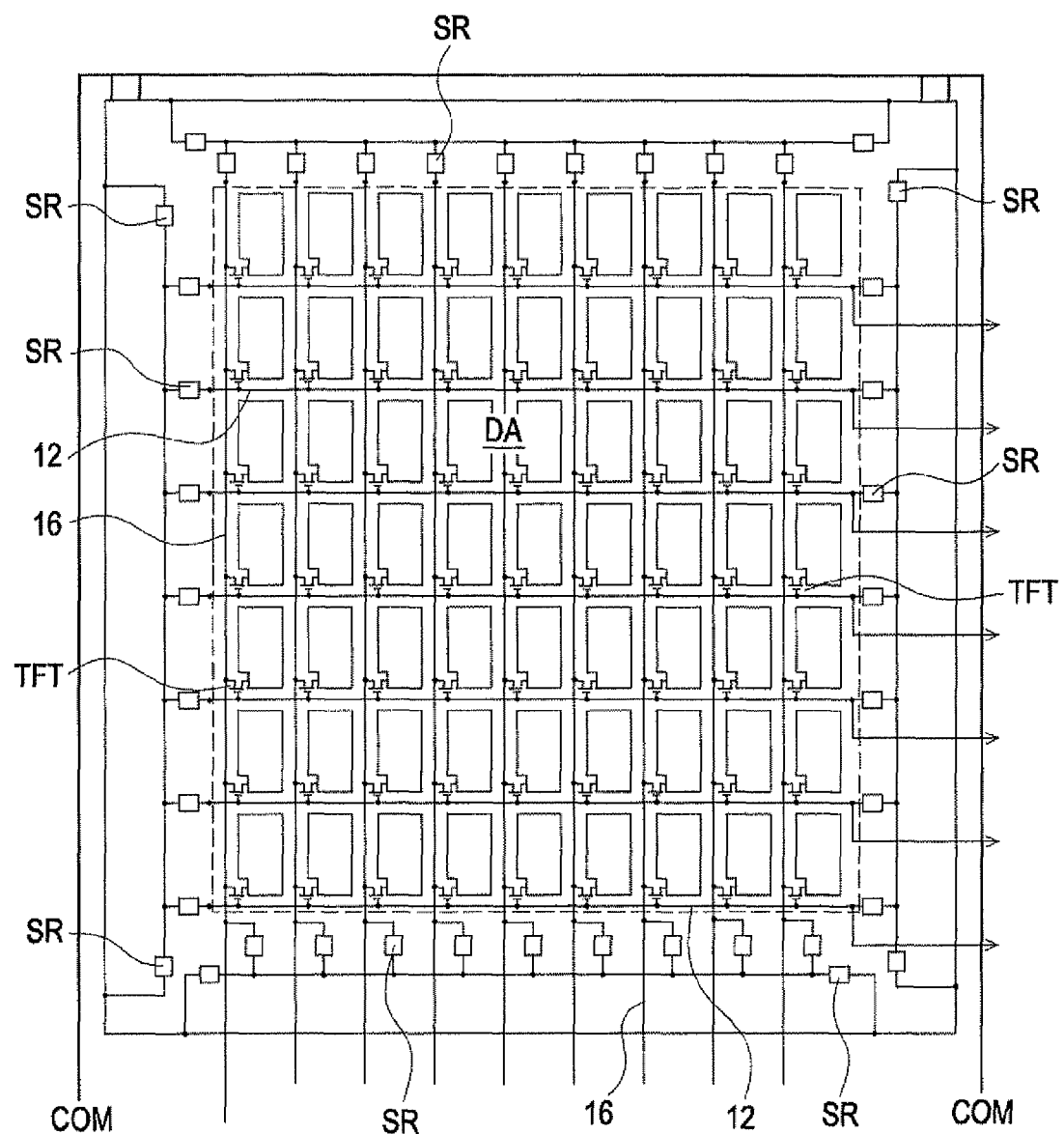
FIG. 4 is an equivalent circuit diagram of the liquid crystal display device according to the first embodiment.
Figure 5E:
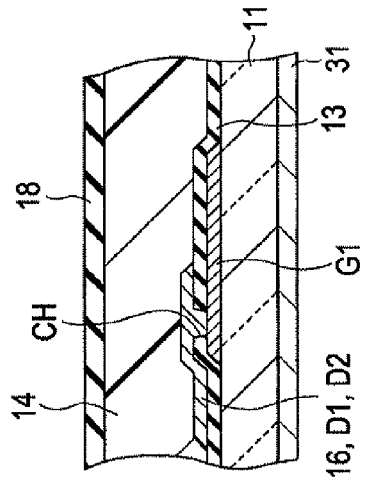
FIG. 5E is a cross-sectional view taken along the lines VE-VE in FIG. 5C.
Figure 5D:
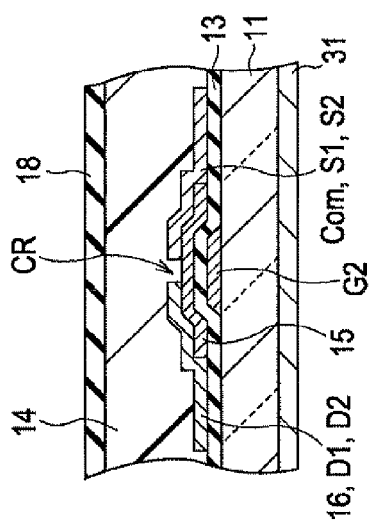
FIG. 5D is a cross-sectional view taken along the lines VD-VD in FIG. 5C.
Figure 5C:
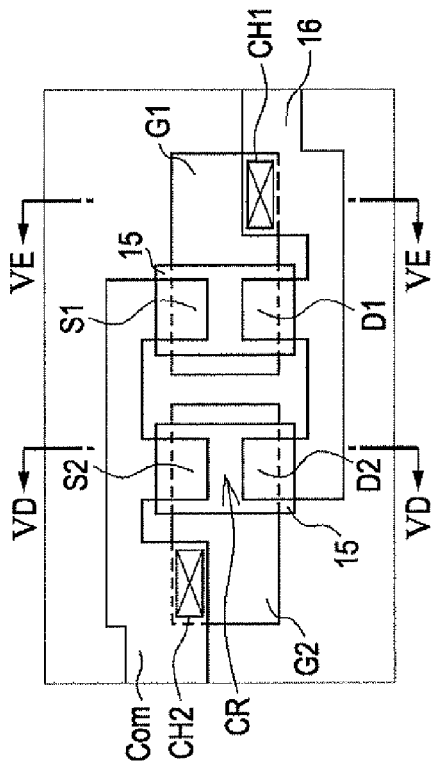
FIG. 5C is a plan view of the electrostatic protection device.
Figure 5A:
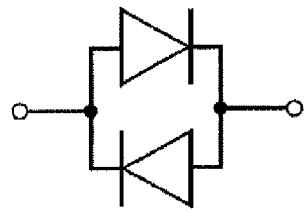
FIG. 5A is an equivalent circuit diagram of an electrostatic protection device.
Figure 5B:
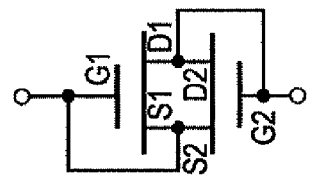
FIG. 5B illustrates a specific connection example of the electrostatic protection device.
Figure 8A:
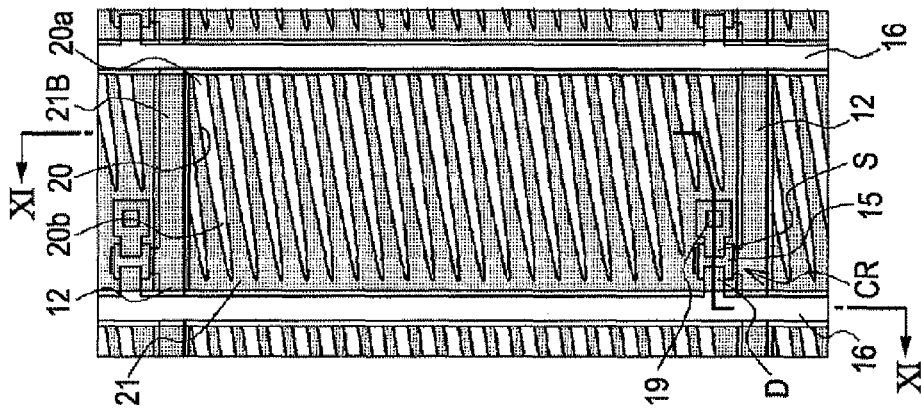
FIG. 8A is an enlarged plan view of one of a plurality of subpixels included in the liquid crystal display device of the second embodiment, as viewed through a color filter substrate.
Figure 8B:
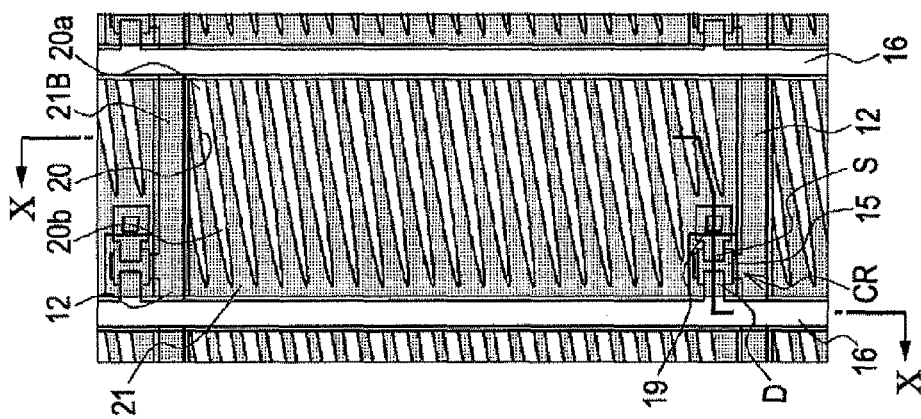
FIG. 8B is an enlarged plan view of one of a plurality of subpixels included in the liquid crystal display device of the third embodiment, as viewed through a color filter substrate.
Figure 8C:
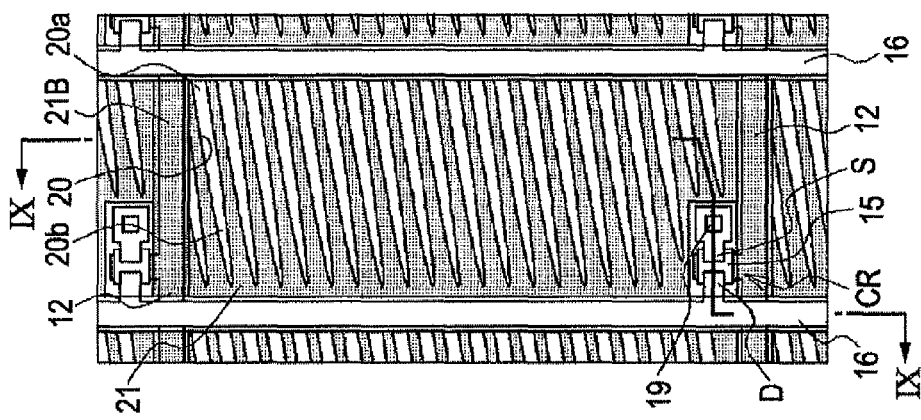
FIG. 8C is an enlarged plan view of one of a plurality of subpixels included in the liquid crystal display device of the fourth embodiment, as viewed through a color filter substrate.
Figure 10:
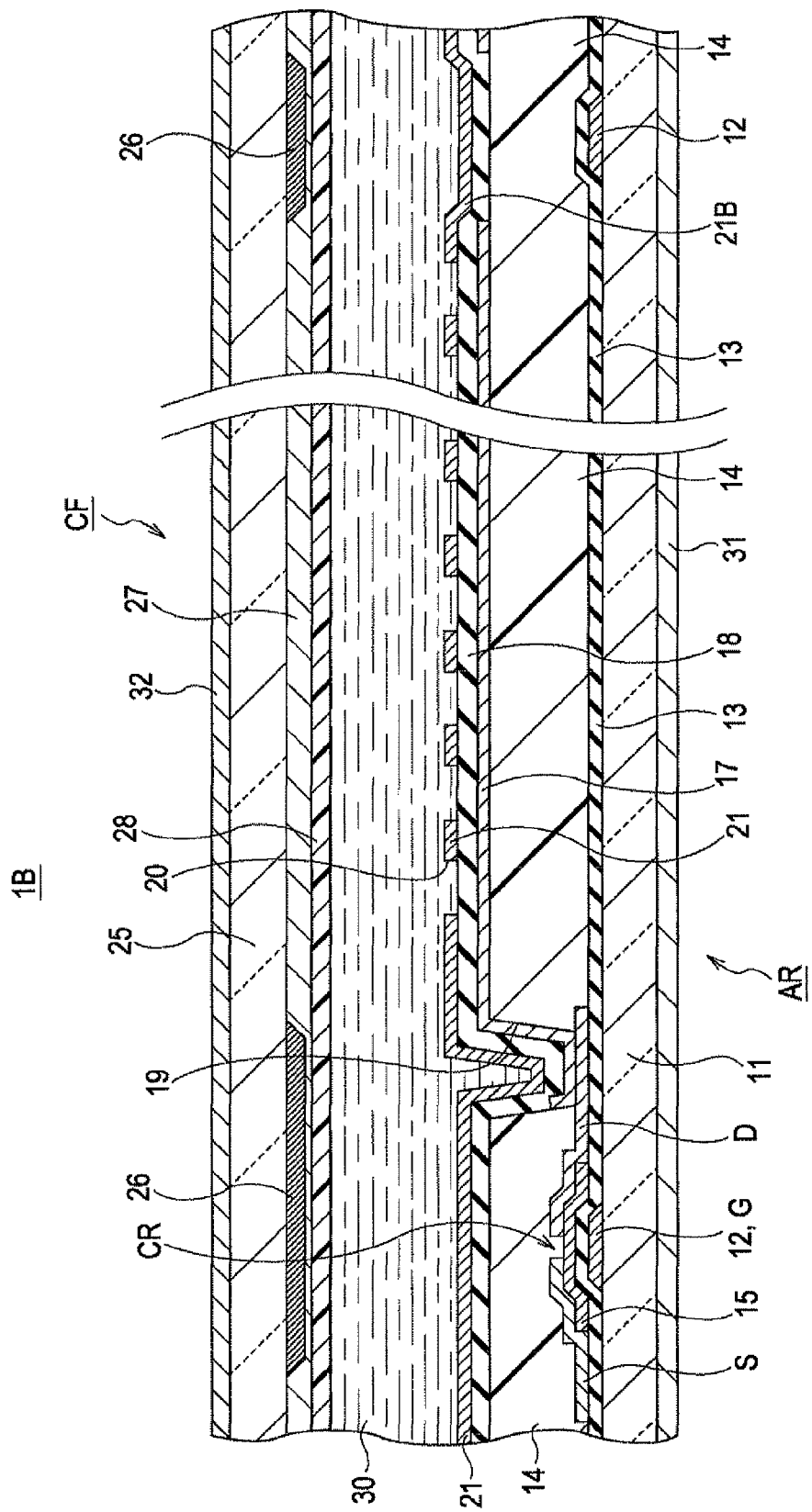
FIG. 10 is a cross-sectional view taken along the lines X-X in FIG. 8B.
Figure 12A:
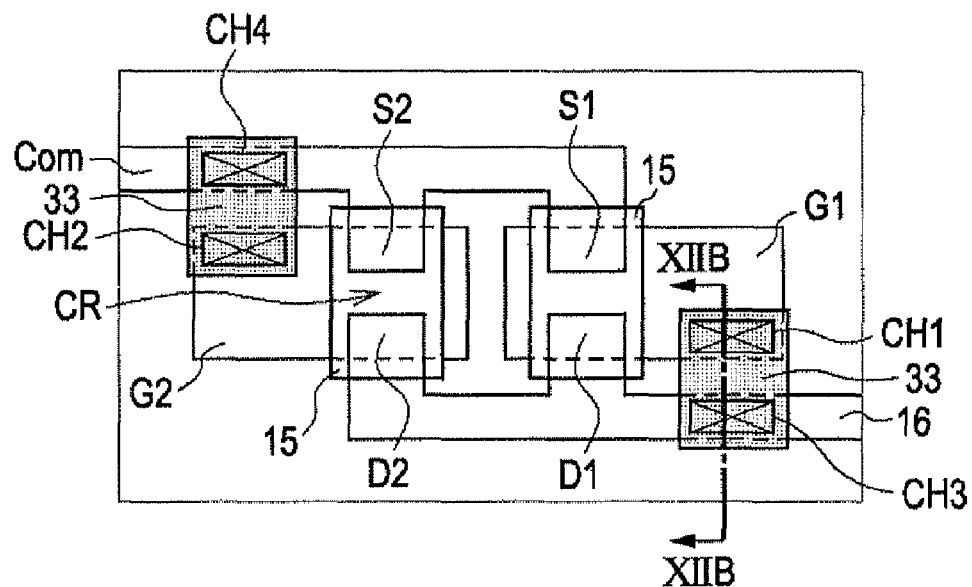
FIG. 12A is a plan view of an electrostatic protection device of a liquid crystal display device according to a sixth embodiment.
Figure 12B:
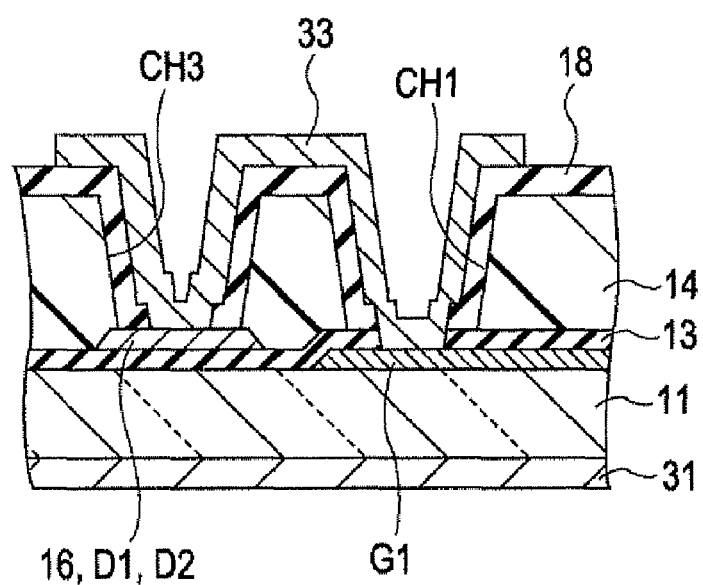
FIG. 12B is a cross-sectional view taken along the lines XIIB-XIIB in FIG. 12A.

FIG. 1 is a plan view of a liquid crystal display device according to first to fourth embodiments of the invention. FIG. 2 is an enlarged plan view of three of a plurality of subpixels included in the liquid crystal display device according to the first embodiment, as viewed through a color filter substrate. FIG. 3 is a cross-sectional view taken along the lines in FIG. 2. FIG. 4 is an equivalent circuit diagram of the liquid crystal display device according to the first embodiment. FIG. 5A is an equivalent circuit diagram of an electrostatic protection device; FIG. 5B illustrates a specific connection example of the electrostatic protection device; FIG. 5C is a plan view of the electrostatic protection device; FIG. 5D is a cross-sectional view taken along the lines VD-VD in FIG. 5C; and FIG. 5E is a cross-sectional view taken along the lines VE-VE in FIG. 5C. FIGS. 6A to 6E are cross-sectional views of a main part illustrating the manufacturing processes of the liquid crystal display device according to the embodiments. FIGS. 7A to 7D are cross-sectional views of the main part illustrating the manufacturing processes of the liquid crystal display device according to the embodiments, subsequent to those of FIGS. 6A to 6E. FIG. 8A is an enlarged plan view of one of a plurality of subpixels included in the liquid crystal display device of the second embodiment, as viewed through a color filter substrate; FIG. 8B is an enlarged plan view of one of a plurality of subpixels included in the liquid crystal display device of the third embodiment, as viewed through a color filter substrate; and FIG. 8C is an enlarged plan view of one of a plurality of subpixels included in the liquid crystal display device of the fourth embodiment, as viewed through a color filter substrate. FIG. 9 is a cross-sectional view taken along the lines IX-IX in FIG. 8A. FIG. 10 is a cross-sectional view taken along the lines X-X in FIG. 8B. FIG. 11 is a cross-sectional view taken along the lines XI-XI in FIG. 8C. FIG. 12A is a plan view of an electrostatic protection device of a liquid crystal display device according to a sixth embodiment; and FIG. 12B is a cross-sectional view taken along the lines XIIB-XIIB in FIG. 12A.

It should be noted that the word "surface" of an array substrate or a color filter substrate indicates the side on which various lines are formed or the side facing a liquid crystal. Moreover, it should be noted that the layers and components in the drawings used in this specification are illustrated with different scales from the original scales such that they are illustrated with dimensions recognizable to the viewer. This means that the layers and components in the drawings are not necessarily illustrated in proportion to their actual dimensions.

First Embodiment

As shown in FIG. 1, a liquid crystal display device 1 according to the embodiment is a so-called chip on glass (COG) type liquid crystal display device which includes an array substrate AR, a color filter substrate CF, a sealing member 2 bonding the array substrate AR and the color filter substrate CF together, and liquid crystals 30 (see FIG. 3) enclosed in a region surrounded by the array substrate AR, the color filter substrate CF, and the sealing member 2. In this liquid crystal display device 1, a region surrounded by the sealing member 2 forms a display area DA and the peripheral portion of the display area DA serves as a frame area. The sealing member 2 has formed therein an inlet 2a for injection of the liquid crystals 30. Referring to FIG. 1, the region corresponding to the display area DA is indicated as a shaded area with a grid pattern.

The array substrate AR is configured with a transparent substrate 11 which is formed of glass or the like and has various lines thereon. The array substrate AR is longer than the color filter substrate CF in its longitudinal direction, and thus has an extending portion 11a which extends outwardly when the above-mentioned substrates AR and CF are bonded together. The extending portion 11a has formed therein an IC chip for outputting a driving signal or a driver Dr configured with LSI or the like. In the frame area of the array substrate AR, various drawing lines (not illustrated) are formed for transmitting various signals from the driver Dr to later-described scan lines 12 and signal lines 16, and furthermore, common lines Com are formed which are connected to later-described common electrodes 21. The driver Dr includes various driver circuits such as a scan line-driving circuit, a signal line-driving circuit, a demultiplexer, or a level shifter, and various logic circuits such as an inverter circuit, a NAND circuit, a NOR circuit, or a ring oscillator. The driver Dr may be sometimes formed on the transparent substrate 11 when the TFTs of the display area DA which are used as the switching elements are LTPS type TFTs.

Next, the structures of the substrates will now be described with referring to FIGS. 2 and 5. First, on the array substrate AR, a plurality of scan lines 12 are formed parallel with each other on the surface of the transparent substrate 11 as illustrated in FIGS. 2 and 3. The scan lines 12 have a two-layer structure of molybdenum/aluminum (Mo/Al), for example. When the scan lines 12 and the like are formed, a plurality of gate lines (not illustrated) is formed on the peripheral portion of the display area so as to be extended towards the driver Dr. The entire surface of the transparent substrate 11 having the scan lines 12 and the gate lines formed thereon is covered with a gate insulating film (a first insulating film) 13 which is formed of a transparent insulating material such as silicon nitride, silicon oxide or the like. On the surface of the gate insulating film 13, a semiconductor layer 15 formed of an amorphous silicon (a-Si) layer is formed at a region in which the switching elements (e.g. TFTs) are formed. A region in which the semiconductor layer 15 is formed on the scan lines 12 constitutes the region of gate electrodes G of the TFTs.

The signal lines 16 and drain electrodes D are formed on the surface of the gate insulating film 13. The signal lines 16 include source electrodes S which are, for example, formed of a conductive layer having a three-layer structure of molybdenum/aluminum/molybdenum (Mo/Al/Mo). When the signal lines 16 and the drain electrodes D are formed, a plurality of source lines (not illustrated) is formed on the peripheral portion of the display area so as to be extended towards the driver Dr. The source electrode S and the drain electrodes D of the signal lines 16 are formed so as to partially overlap with the surface of the semiconductor layer 15. The entire surface of the array substrate AR is covered with an interlayer resin film 14 formed of a photosensitive material, and contact holes 19 are formed at positions of the interlayer resin film 14 corresponding to the drain electrodes D. In this way, the liquid crystal display device 1 of the first embodiment does not have the passivation film as used in the related art, but the channel regions CR of the TFTs are directly covered with the interlayer resin film 14.

Moreover, lower electrodes (first electrodes) 17 are formed with the patterns illustrated in FIG. 2 on the interlayer resin film 14 at regions surrounded by the scan lines 12 and the signal lines 16. The lower electrodes 17 are formed of a transparent conductive material such as ITO or IZO. The lower electrodes 17 are electrically connected to the drain electrodes D via the contact holes 19. Therefore, the lower electrodes 17 function as pixel electrodes. Furthermore, an inter-electrode insulating film (second insulating film) 18 is formed on the lower electrodes 17. A transparent insulating material exhibiting good insulation property such as silicon nitride is used as a material of the inter-electrode insulating film 18. Upper electrodes (second electrodes) 21 having a plurality of slits 20 are formed on the inter-electrode insulating film 18 at regions surrounded by the scan lines 12 and the signal lines 16. The upper electrodes 21 are formed of a transparent conductive material such as ITO or IZO. Additionally, the upper electrodes 21 are formed in every pixel region and are connected to each other via connecting portions 21B, whereby the upper electrodes 21 are electrically connected to the common lines Com (see FIG. 4) which have one end thereof being connected to the frame area of the liquid crystal display device 1. The common lines Com and the upper electrodes 21 are connected at the Z portion in FIG. 1, for example, and the other end of the common lines Com are connected to the driver Dr. A predetermined alignment layer (not illustrated) is formed on the entire surface of the substrate.

In each region surrounded by the scan lines 12 and the signal lines 16, the upper electrode 21 having the slits 20 form a comb-like pattern in plan view, such that one end of each slit 20 adjacent to one of the signal lines 16 is an open end 20a whereas the other end of the slit 20 is a closed end 20b. This increases the aperture ratio at the open end 20a side of the upper electrode 21, thereby allowing for a brighter display.

As illustrated in FIG. 4, in the peripheral portion of the display area DA, the scan lines 12 and the signal lines 16 are connected to the common lines Com via an electrostatic protection device SR in order to protect the TFTs of the display area DA, which are used as the switching elements, against externally generated static electricity. The electrostatic protection device SR of which the equivalent circuit is illustrated in FIG. 5A is configured by a parallel circuit of two diodes connected in opposite directions and is formed by TFTs having two diodes connected thereto as illustrated in FIG. 5B. Specifically, the electrostatic protection device SR has a structure such that one terminal thereof is electrically connected to the gate electrode G1 and source electrode S1 of a first TFT and the source electrode S2 of a second TFT, and the other terminal thereof is electrically connected to the gate electrode G2 and drain electrode D2 of the second TFT and the drain electrode D1 of the first TFT.

The detailed structure of the electrostatic protection device SR which is connected between each of the signal lines 16 and each of the common lines Com will be described with reference to FIGS. 5C to 5D. The TFT portion that forms the diodes has a structure such that the surfaces of the gate electrode G1 of the first TFT and the gate electrode G2 of the second TFT which are formed simultaneously with the scan line 12 are covered with the gate insulating film 13, and the semiconductor layer 15 is formed on the portions of the gate insulating film 13 above the gate electrodes G1 and G2. Moreover, the drain electrode D1 and source electrode S1 of the first TFT and the drain electrode D2 and source electrode S2 of the second TFT which are formed simultaneously with the signal line 16 are formed so as to partially overlap with the surface of the semiconductor layer 15. The signal line 16 is electrically connected to the gate electrode G1 of the first TFT via a contact hole CH1 which is formed in the gate insulating film 13. Similarly, the common line Com is electrically connected to the gate electrode G2 of the second TFT via a contact hole CH2 which is formed in the gate insulating film 13.

The entire surface of the electrostatic protection device SR is covered with the interlayer resin film 14 which includes the channel regions CR of the first and second TFTs and is formed of a photosensitive material, and the surface of the interlayer resin film 14 is covered with the inter-electrode insulating film 18. In this way, the liquid crystal display device 1 of the first embodiment does not have the passivation film as used in the related art, and has a structure such that the channel regions CR of the first and second TFTs of the electrostatic protection device SR are covered with the interlayer resin film 14 and the surface of the interlayer resin film 14 is covered with the inter-electrode insulating film 18.

The color filter substrate CF is configured with a transparent substrate 25 which is formed of glass or the like and has black matrixes 26 formed thereon so as to cover positions corresponding to the scan lines 12 of the array substrate AR, the signal lines 16, and the TFTs. A color filter layer 27 of a plurality of colors, for example, the three colors of red (R), green (G) and blue (B) is formed on portions of the surface of the transparent substrate 25 surrounded by the black matrixes 26. A protective film 28 formed of resin or the like is formed so as to cover the surface of the black matrixes 26 and the color filter layer 27. A predetermined alignment layer (not illustrated) is laminated over the entire surface of the substrate. In addition, polarization plates 31 and 32 are respectively provided on the exterior surfaces of the array substrate AR and the color filter substrate CF.

Next, the manufacturing process for the array substrate AR will be described with reference to FIGS. 6 and 7. In FIGS. 6 and 7, for better understanding of the structure, the TFT portion of the display area DA, the TFT portion of the electrostatic protection device SR, and the contact hole portion are illustrated in parallel. Since the two TFTs of the electrostatic protection device SR and the two contact holes respectively have substantially the same structures, only one TFT and only one contact hole are illustrated as a representative.

Figure 6A:
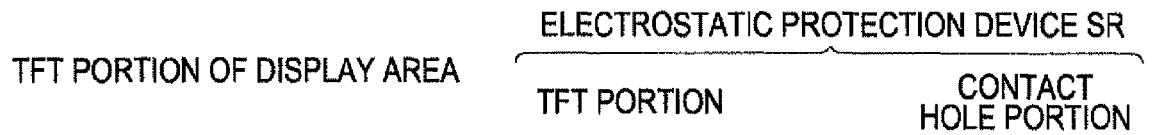
FIGS. 6A to 6E are cross-sectional views of a main part illustrating the manufacturing processes of the liquid crystal display device according to the embodiments.
Figure 6B:
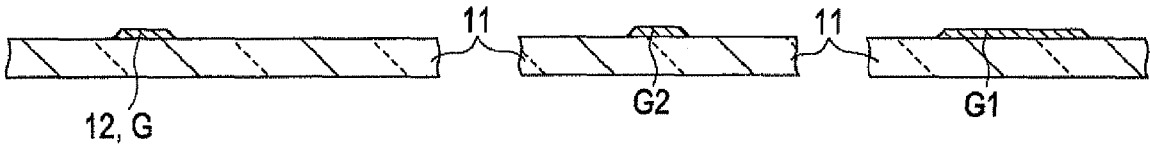
Figure 6C:
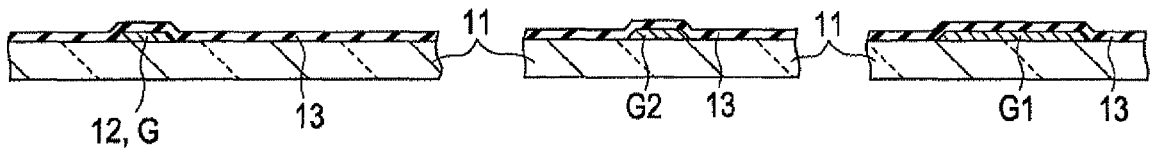
Figure 6D:
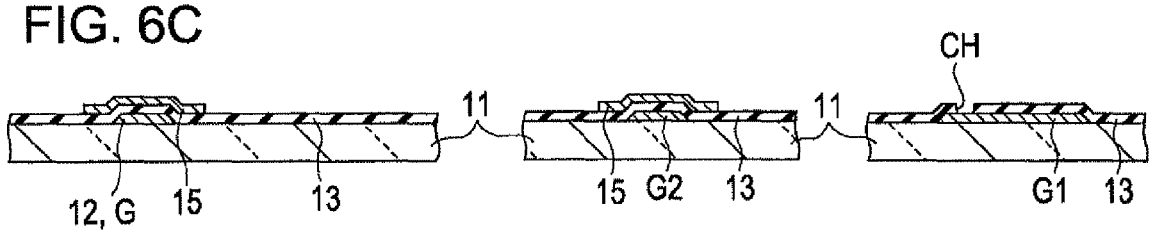
Figure 6E:
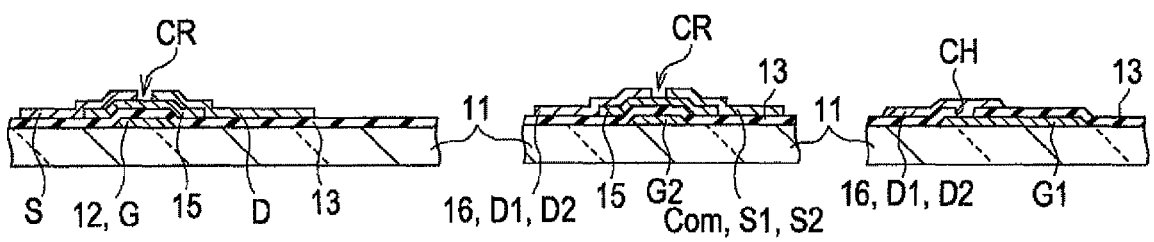

First, the pluralities of scan lines 12 are patterned on the transparent substrate 11 by known methods such as a photolithographic method, and at the same time, the gate electrodes G1 and G2 of the electrostatic protection device SR are patterned (see FIG. 6A). Next, the gate insulating film 13 is deposited on the entire surface of the transparent substrate 11 including the scan lines 12, by known methods such as a plasma chemical-vapor deposition (CVD) method or a sputtering method (see FIG. 6B). Following this, the semiconductor layer 15 is patterned so as to cover a portion of the scan lines 12 and the gate electrodes G1 and G2 of the electrostatic protection device SR by known methods such as a photolithographic method. After that, the contact hole CH1 (and CH2) is formed so as to expose the surfaces of the gate electrodes G1 and G2 of the electrostatic protection device SR (see FIG. 6C).

After that, the pluralities of signal lines 16 are patterned so as to intersect the pluralities of scan lines 12 by known methods such as a photolithographic method. At the same time, the source electrode S and the drain electrodes D each having one end thereof overlapping with the semiconductor layer 15 are patterned, and the source electrodes S1 and S2 and the drain electrodes D1 and D2 of the electrostatic protection device SR are patterned (see FIG. 6D). At this time, the drain electrodes D1 and D2 of the electrostatic protection device SR are respectively connected to the gate electrodes G1 and G2 via the contact holes CH1 and CH2, and one of the drain electrodes is formed to be integral with the signal line 16 and the other drain electrode is formed to be integral with the common line Com.

In the first embodiment, the TFTs of the display area DA and the electrostatic protection device SR are formed by a so-called channel-etching method in which the source electrodes S and the drain electrodes D are directly superposed on the semiconductor layer 15 so as to form the TFTs. The channel regions CR (and CR1 and CR2) are defined by the region formed between the end of the source electrode S, which is superposed on the semiconductor layer 15, and the end of the drain electrode D, which is superposed on the semiconductor layer 15. In the drawings, the channel regions CR (and CR1 and CR2) are in an exposed state. The preceding process steps correspond to the first step of the manufacturing method of the liquid crystal display device of the invention.

In the liquid crystal display devices of the related art, the passivation film formed of silicon nitride or silicon oxide is formed so as to cover the entire surface of the transparent substrate 11 having the TFTs formed thereon, by known methods such as a plasma CVD method and a sputtering method. On the contrary, in this invention, the interlayer resin film 14 is directly formed on the surface of the transparent substrate 11 having the TFTs formed thereon, without the passivation film formed on the surface of the display area DA and the electrostatic protection device SR. More particularly, the interlayer resin film 14 formed of a photosensitive material such as photoresist is formed on the surface of the transparent substrate 11 having the TFTs formed thereon (see FIG. 6E), and after prebaking is performed thereon, the interlayer resin film 14 is exposed by a known exposure device and is simultaneously subjected to a photoreaction process and a baking process. Therefore, the interlayer resin film 14 is formed so as to directly cover the channel regions CR (and CR1 and CR2) of the TFTs of the display area DA and the electrostatic protection device SR, and the surfaces of the source electrodes S (and S1 and S2) and the drain electrodes D (and D1 and D2).

The photoreaction process is a process conducted for improving transparency of a photosensitive resin film, under which photosensitive functional groups are irradiated with UV light so as to cause photoreaction. The baking process is a process under which the photosensitive resin patterned is fired by heating so that the resin is formed on the substrate as a both chemically and physically stable insulating film by causing chemical reactions (mainly, crosslinking reactions) within the resin. It is preferable that the thickness of the formed interlayer resin film 14 is in the range of 1.5 μm to 3.0 μm. If the interlayer resin film 14 has a thickness of less than 1.5 μm, steps are formed at the positions where the TFTs or the like exist, disadvantageously leading to occurrence of steps in the lower electrodes 17 or the upper electrodes 21 formed in the following steps. If the interlayer resin film 14 has a thickness of more than 3.0 μm, the optical absorption rate of the interlayer resin film 14 increases, disadvantageously lowering the brightness of the display area DA.

When the interlayer resin film 14 is formed, the contact hole 19 is formed in the interlayer resin film 14 above the drain electrodes D of the display area DA (see FIG. 7A). The contact hole 19 is directly formed without the passivation film disposed on the interlayer resin film 14 when the interlayer resin film 14 is exposed and developed. In the related art, the drain electrodes D could not be exposed to the outside unless the passivation film formed below the contact hole 19 is removed by etching. However, in the invention, the drain electrodes D can be exposed to the outside without the etching step. Moreover, since the surface of the electrostatic protection device SR is also covered with the interlayer resin film 14, the surface of the electrostatic protection device 14 is not exposed to the outside during the developing process of the interlayer resin film 14. Therefore, it is possible to decrease the possibility of the electrostatic protection device SR being damaged by static electricity during the developing process of the interlayer resin film 14. These process steps correspond to the second step of the manufacturing method of the liquid crystal display device of the invention.

Next, in the display area DA, the lower electrodes 17 are formed in each of the pixel regions defined by the scan lines 12 and the signal lines 16 (see FIG. 7B). At this time, parts of the lower electrodes 17 are deposited inside of the contact hole 19 so that the lower electrodes 17 and the drain electrodes D are electrically connected. Therefore, the lower electrodes 17 function as the pixel electrodes. This process step corresponds to the third step of the manufacturing method of the liquid crystal display device of the invention.

The inter-electrode insulating film (second insulating film) 18 is formed so as to cover the entire substrate on which the lower electrodes 17 are formed (see FIG. 7C). When the inter-electrode insulating film 18 is formed of a material having good insulation properties such as silicon nitride, it is possible to prevent an undesirable increase in the interior diameter of the contact hole 19. Moreover, the thickness of the inter-electrode insulating film 18 may preferably be 2000 angstrom or more in order to secure sufficient moisture resistance and insulation properties for the channel regions CR (and CR1 and CR2) of the TFTs, the source electrodes S (and S1 and S2), and the drain electrodes D (and D1 and D2). If the thickness of the inter-electrode insulating film 18 is greater than 6000 angstrom, the capacitance between the lower electrode 17 and the upper electrode 21 decreases, which disadvantageously results in noticeable flicker and a higher voltage being necessary for activating the liquid crystal molecules. This process step corresponds to the fourth step of the manufacturing method of the liquid crystal display device of the invention.

After the inter-electrode insulating film 18 is formed, the upper electrodes 21 having the pluralities of slits 20 formed therein are formed at positions corresponding to the pixel regions (see FIG. 7D). Specifically, the upper electrodes 21 are formed by depositing a transparent conductive material such as ITO or IZO so as to cover the entire surface of the inter-electrode insulating film 18 by the known photolithographic and etching methods. As illustrated in FIGS. 2 and 3, the upper electrodes 21 are formed on the regions except the positions corresponding to the TFTs and are connected to each other between adjacent pixel regions via the connecting portions 21B. Moreover, the upper electrodes 21 are electrically connected to the common lines Com which are connected to the frame area of the liquid crystal display device 1. Therefore, the upper electrodes 21 function as the common electrodes. In this way, the array substrate AR is completed by forming an alignment film (not illustrated) so as to cover the entire surface of the transparent substrate 11 on which the upper electrodes 21 are formed. This process step corresponds to the fifth step of the manufacturing process for the liquid crystal display device of the invention.

After that, a color filter substrate is prepared which is substantially the same as the color filter substrate of the FFS mode liquid crystal display device of the related art, and the above-described array substrate and the color filter substrate are bonded together so as to oppose each other with liquid crystals enclosed therein, whereby the liquid crystal display device 1 of the first embodiment is complete. This process step corresponds to the sixth step of the manufacturing method of the liquid crystal display device of the invention.

As described above, in the liquid crystal display device 1 of the invention, since the interlayer resin film 14 is directly formed without forming the passivation film, the channel regions CR of the TFTs of the display area DA and the electrostatic protection device SR are directly covered with the inter-electrode insulating film 14. Therefore, the channel regions CH1 and CH2 of the TFTs of the electrostatic protection device SR are not exposed to the surroundings until the inter-electrode insulating film 18 is formed. Thus, the TFTs of the peripheral circuit are prevented from being damaged, thus decreasing the variation in the characteristics of the TFTs, providing improved reliability thereof, and providing high throughput of the liquid crystal display device 1.

In addition, since the surface of the interlayer resin film 14 is further covered with the inter-electrode insulating film 18 having a predetermined thickness, as illustrated in FIGS. 3 and 5D, sufficient moisture resistance can be guaranteed. According to the manufacturing method of the liquid crystal display device 1 of the invention, it is not necessary to perform the film forming process for the passivation film and the etching process for etching a portion of the passivation film to expose the drain electrodes D to the exterior, which were necessary processes with the manufacturing method of the array substrate of the related art. Therefore, according to the method for manufacturing the liquid crystal display device 1 of the invention, it is possible to simplify the manufacturing process, and hence, to manufacture the liquid crystal display device at a low cost.

The liquid crystal display device 1 of the first embodiment has been described with respect to an example where the electrostatic protection device SR is formed as the peripheral circuit which is formed in the peripheral portion of the display area DA. The liquid crystal display device 1 can be applied to a case where the peripheral circuit includes TFTs, such as a scan line-driving circuit, a signal line-driving circuit, a demultiplexer, or a level shifter, and various logic circuits such as an inverter circuit, a NAND circuit, a NOR circuit, or a ring oscillator. Moreover, although the liquid crystal display device 1 of the first embodiment has been described with respect to the example where the upper electrode 21 having the slits 20 form a comb-like pattern in plan view, such that one end of each slit 20 adjacent to one of the signal lines 16 is an open end 20a whereas the other end of the slit 20 is a closed end 20b, both ends of the slit 20 may be closed ends. Furthermore, although the upper electrodes 21 have been described as not being located on the interlayer resin film 14 above the TFTs, other structures may be employed and they may be formed in a beta form except the locations of the slits 20.

Next, the structure of a liquid crystal display device according to the second to sixth embodiments will be described with reference to FIGS. 8 to 12. In the following description, the same constituent elements as those of the liquid crystal display device of the first embodiment will be denoted by the same reference numerals, and the detailed description thereof will be omitted.

Second Embodiment

A liquid crystal display device 1A of the second embodiment has a structure such that the first electrode 17 of the display area DA extends so as to cover the TFTs used as the switching elements as viewed in plan view, as illustrated in FIGS. 8A and 9, and other structures are the same as those of the liquid crystal display device of the first embodiment.

Since the first electrode 17 is formed so as to cover the TFTs as viewed in plan view, the TFTs are covered with the first electrode 17 as well as the interlayer resin film 14 and the second insulating film 18. Therefore, according to the liquid crystal display device 1A of the second embodiment, the first electrode 17 can sufficiently function as the protective film, and it is thus possible to more effectively suppress variation in the characteristics of the switching elements due to external causes and to ensure long-term reliability of the switching elements.

Third Embodiment

A liquid crystal display device 1B of the third embodiment has a structure such that the second electrode 21 of the display area DA extends so as to cover the TFTs used as the switching elements as viewed in plan view, as illustrated in FIGS. 8B and 10, and other structures are the same as those of the liquid crystal display device of the first embodiment.

Since the second electrode 21 is formed so as to cover the TFTs as viewed in plan view, the TFTs are covered with the second electrode 21 as well as the interlayer resin film 14 and the second insulating film 18. Therefore, according to the liquid crystal display device 1B of the third embodiment, the second electrode 21 can sufficiently function as the protective film, and it is thus possible to more effectively suppress variation in the characteristics of the switching elements due to external causes and to ensure long-term reliability of the switching elements.

Fourth Embodiment

A liquid crystal display device 1C of the fourth embodiment has a structure such that the first and second electrodes 17 and 21 extend so as to cover the TFTs used as the switching elements, as illustrated in FIGS. 8C and 11, and other structures are the same as those of the liquid crystal display device of the first embodiment.

Since the first and second electrodes 17 and 21 are formed so as to cover the TFTs as viewed in plan view, the TFTs are covered with the first and second electrodes 17 and 21 as well as the interlayer resin film 14 and the second insulating film 18. Therefore, the first and second electrodes 17 and 21 can further function as the protective film, and it is thus possible to more effectively suppress variation in the characteristics of the switching elements and to improve the long-term reliability of the switching elements. Moreover, since the size of the surface opposing the first and second electrodes 17 and 21 increases, it is possible to obtain a larger auxiliary capacitance. Thus, it is possible to suppress flicker and thus to improve the display quality.

The manufacturing processes of the liquid crystal display devices of the second to fourth embodiments are the same as the manufacturing process of the liquid crystal display device 1 of the first embodiment, except that the first electrode 17 and/or the second electrode 21 is formed to extend over the TFTs in plan view, and the detailed description thereof will be omitted.

Fifth Embodiment

In the fifth embodiment, silicon resin is used in place of the photosensitive resin such as photoresist, which was used for the interlayer resin film 14 of the liquid crystal display device 1 of the first embodiment. The liquid crystal display device of the fifth embodiment has the same structure as that of the liquid crystal display device 1 of the first embodiment, except that the material of the interlayer resin film 14 is different, and the manufacturing method thereof is substantially the same, and therefore illustrations thereof will be omitted. The silicon resin comprises an organopolysiloxane chain as its main chain and is also referred to as silicon. When the silicon resin is used for the interlayer resin film 14, the firing temperature of the interlayer resin film 14 can be increased to be higher than that of the photosensitive resin. Therefore, the film forming temperature of the second insulating film can be increased, and thus the formed second insulating film can have a higher density than that when using the photosensitive resin for the interlayer resin film 14. Therefore, the liquid crystal display device of the fifth embodiment can provide better moisture resistance than the liquid crystal display device 1 of the first embodiment.

Sixth Embodiment

The electrostatic protection device SR of the liquid crystal display device 1 of the first embodiment was described with respect to an example where the signal lines 16 and the gate electrodes G1 of the first TFTs are electrically connected via the contact hole CH1 at the source line portions which are simultaneously formed with the signal lines 16, and the common lines Com and the gate electrodes G2 of the second TFTs are electrically connected via the contact hole CH2 at the source line portions. However, the predetermined advantages of the invention can be achieved as long as the channel regions CR1 and CR2 of the TFTs of the peripheral circuit are covered with at least the interlayer resin film 14 until the inter-electrode insulating film 18 of the display area DA is formed. Since the scan lines 12 and the signal lines 16 of the display area DA decrease the surface size necessary for wiring, it is common practice to have the gate lines and the source lines being bridge-connected via the transparent conductive material on the peripheral portion of the display area DA so as to be appropriately and selectively connected to the driver Dr or the like.

In the liquid crystal display device of the sixth embodiment, the electrical connections between the signal lines 16 of the electrostatic protection device SR and the gate electrodes G1 of the first TFTs and between the common lines Com and the gate electrodes G2 of the second TFTs are achieved by bridge-connection via the transparent conductive material at the time of forming the upper electrodes 21. The liquid crystal display device of the sixth embodiment has the same structure as that of the liquid crystal display device 1 of the first embodiment, except that the structure of the electrostatic protection device SR is different, and the manufacturing method thereof is substantially the same, and therefore illustrations thereof will be omitted. Moreover, the structures of the channel regions CR of the first and second TFTs of the electrostatic protection device SR of the sixth embodiment are the same as those of the electrostatic protection device SR of the first embodiment illustrated in FIG. 5D, and the structures will be described with reference to FIG. 5D.

The electrostatic protection device SR of the sixth embodiment has a structure such that the surfaces of the gate electrode G1 of the first TFT and the gate electrode G2 of the second TFT which are formed simultaneously with the scan line 12 are covered with the gate insulating film 13, and the semiconductor layer 15 is formed on the portions of the gate insulating film 13 above the gate electrodes G1 and G2. Moreover, the drain electrode D1 and source electrode S1 of the first TFT and the drain electrode D2 and source electrode 82 of the second TFT which are formed simultaneously with the signal line 16 are formed so as to partially overlap with the surface of the semiconductor layer 15. The entire surface of the electrostatic protection device SR is covered with the interlayer resin film 14 which includes the channel regions CR of the first and second TFTs and is formed of a photosensitive material, and the surface of the interlayer resin film 14 is covered with the inter-electrode insulating film 18.

Moreover, a contact hole CH1 is formed in the gate insulating film 13, the interlayer resin film 14, and the inter-electrode insulating film 18 above the gate electrode G1 of the first TFT, and a contact hole CH3 is formed in the interlayer resin film 14 and the inter-electrode insulating film 18 on the surface of the signal line 16. Moreover, a contact hole CH2 is formed in the gate insulating film 13, the interlayer resin film 14, and the inter-electrode insulating film 18 above the gate electrode G2 of the second TFT, and a contact hole CH4 is formed in the interlayer resin film 14 and the inter-electrode insulating film 18 on the surface of the common line Com. Furthermore, when the upper electrodes 21 (see FIGS. 2 and 3) are formed, a conductive film 33 formed of the same material as the upper electrodes 21 is formed so that the contact holes CH1 and CH3 and the contact holes CH2 and CH4 are respectively electrically connected in a bridge form.

As described above, in the liquid crystal display device of the sixth embodiment, since the channel region CR of the electrostatic protection device SR is covered with the interlayer resin film 14 and the inter-electrode insulating film 18 (see FIG. 5D), the channel region CR is not exposed when the contact holes CH1 to CH4 are formed in the gate insulating film 13, the interlayer resin film 14, and the inter-electrode insulating film 18. Therefore, in the liquid crystal display device of the sixth embodiment, the TFTs of the peripheral circuit are prevented from being damaged, thus decreasing the variation in the characteristics of the TFTs, providing improved reliability thereof, and providing high throughput of the liquid crystal display device. Moreover, in the liquid crystal display device of the sixth embodiment, when the electrostatic protection device SR is manufactured, the steps of forming the contact holes CH1 to CH4 can be performed simultaneously with the step of forming the contact hole 19 (see FIGS. 2 and 3) for connecting the upper electrodes 21 of the display area DA to the drain electrodes D of the TFTs, and the step of forming the conductive film 33 can be performed simultaneously with the step of forming the upper electrodes 21. Therefore, the number of manufacturing process steps will not be increased unnecessarily.

The FFS mode liquid crystal display device has been described as the first to sixth embodiments of the invention. Such liquid crystal display device of the invention may be employed in various kinds of electronic apparatuses such as a personal computer, a cellular phone, a personal digital assistant, a navigation system, a portable audio player, or a portable television.

The entire disclosure of Japanese Patent Application No. 2008-306043, filed Dec. 1, 2008 is expressly incorporated by reference herein.

What is claimed is:
1. A liquid crystal display device comprising:
a liquid crystal layer; and
a pair of substrates that enclose the liquid crystal layer therebetween, wherein:
the liquid crystal layer side of one of the pair of substrates being provided with:
a plurality of scan lines and signal lines that are arranged in a matrix on a display area with a first insulating film therebetween;

thin film transistors which are formed at the vicinities of the intersections of the plurality of scan lines and signal lines, and of which the channel regions are exposed;

an interlayer resin film that covers an entire surface of the display area including the surface of the thin film transistors, first electrodes which are formed of a transparent conductive material and are formed on the surface of the interlayer resin film in each of regions defined by the plurality of scan lines and signal lines so as to be electrically connected to the thin film transistors;

a second insulating film that is formed on an entire surface of the interlayer resin film including the first electrodes; and second electrodes which are formed of a transparent conductive material and are formed on the second insulating film, the second electrodes having a plurality of slits formed at positions corresponding to the regions defined by the plurality of scan lines and signal lines, wherein:

a peripheral circuit, which includes thin film transistors of which the channel regions are exposed, is formed on a peripheral portion of the display area;

the interlayer resin film directly covers the channel regions of the thin film transistors of the display area and directly covers the channel regions of the thin film transistors of the peripheral circuit; and the surface of the interlayer resin film above the thin film transistors on the display area and the surface of the interlayer resin film above the thin film transistors on the peripheral circuit are covered with the second insulating film.

2. The liquid crystal display device according to claim 1, wherein the peripheral circuit includes at least one of an electrostatic protection circuit, a driver circuit, and a logic circuit.

3. The liquid crystal display device according to claim 1, wherein the thickness of the interlayer resin film is in a range of 1.5 μm to 3.0 μm.

4. The liquid crystal display device according to claim 1, wherein the thickness of the second insulating film is in a range of 2000 angstrom to 6000 angstrom.

5. The liquid crystal display device according to claim 1, wherein the thin film transistors of the display area are covered with the first or second electrodes in plan view.

6. The liquid crystal display device according to claim 1, wherein the thin film transistors of the display area are covered with the first and second electrodes in plan view.

7. A method for manufacturing a liquid crystal display device, comprising:

a first step of preparing a first substrate on a display area, including:

a plurality of scan lines and signal lines that are arranged in a matrix on a display area with a first insulating film therebetween;

thin film transistors which are formed at the vicinities of the intersections of the plurality of scan lines and signal lines, and of which the channel regions are exposed; and a peripheral circuit which is formed on a peripheral portion of the display area and includes thin film transistors of which the channel regions are exposed;

a second step of forming an interlayer resin film so as to cover the display area of the first substrate obtained in the first step and the peripheral portion of the display area, the interlayer resin film having a contact hole exposing one of the electrodes of the thin film transistors of the display area;

a third step of forming first electrodes on the surface of the interlayer resin film of the display area in each of regions defined by the plurality of scan lines and signal lines, the first electrodes being formed of a transparent conductive material and electrically connected to one of the electrodes of the thin film transistors;

a fourth step of forming a second insulating film over an entire surface of the interlayer resin film including the first electrodes;

a fifth step of forming second electrodes on the second insulating film of the display area, the second electrodes being formed of a transparent conductive material and having a plurality of slits formed at positions corresponding to the regions defined by the plurality of scan lines and signal lines; and a sixth step of disposing a second substrate so as to oppose the surface of the first substrate obtained in the fifth step with a predetermined distance therebetween, bonding the substrates together, and filling liquid crystals into a space between the first and second substrates.

* * * * *